United States Patent
Mujica et al.

(10) Patent No.: US 7,916,050 B1
(45) Date of Patent: Mar. 29, 2011

(54) TIME-INTERLEAVED-DUAL CHANNEL ADC WITH MISMATCH COMPENSATION

(75) Inventors: Fernando A. Mujica, Allen, TX (US); Charles K. Sestok, Dallas, TX (US); Zigang Yang, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 5 days.

(21) Appl. No.: 12/580,032

(22) Filed: Oct. 15, 2009

(51) Int. Cl.
*H03M 1/06* (2006.01)

(52) U.S. Cl. ........ 341/118; 341/120; 341/155; 455/108; 455/155.1; 455/331; 455/334; 375/316; 375/324; 375/355

(58) Field of Classification Search .................. 341/118, 341/120, 155; 455/108, 115.1, 115.2, 313, 455/334; 375/316, 324, 355, 232
See application file for complete search history.

(56) References Cited

U.S. PATENT DOCUMENTS

| | | | |
|---|---|---|---|
| 6,243,430 B1 * | 6/2001 | Mathe | 375/346 |
| 6,836,227 B2 * | 12/2004 | Asami | 341/118 |
| 7,002,505 B2 | 2/2006 | Hughes | |
| 7,123,896 B2 * | 10/2006 | Chiu | 455/313 |
| 7,139,536 B2 * | 11/2006 | Chiu | 455/115.1 |
| 7,277,040 B2 | 10/2007 | Mazhar | |
| 7,352,316 B2 | 4/2008 | Hori et al. | |
| 7,529,322 B2 * | 5/2009 | Mak et al. | 375/340 |
| 7,541,958 B2 * | 6/2009 | Xu | 341/155 |
| 7,834,786 B2 * | 11/2010 | Kawahito et al. | 341/120 |
| 2010/0182174 A1 * | 7/2010 | Johansson et al. | 341/118 |
| 2010/0253414 A1 * | 10/2010 | Dedic et al. | 327/415 |

* cited by examiner

*Primary Examiner* — Linh V Nguyen
(74) *Attorney, Agent, or Firm* — John J. Patti; Wade J. Brady, III; Frederick J. Telecky, Jr

(57) ABSTRACT

Previously, when designing receivers for radio frequency (RF) or wireless communications, designers chose between time-interleaved (TI) analog-to-digital converters (ADCs) for intermediate frequency architectures and dual channel ADCs for direct conversion architectures. Here, similarities between TI ADCs and dual channel ADC were recognized, and an ADC that has the capability of operating as a TI ADCs and dual channel ADC is provided. This allows designer to have greatly increased flexibility during the design process which can greatly reduce design costs, while also allowing the manufacturer of the ADC to realize a reduction in its operating costs.

13 Claims, 3 Drawing Sheets

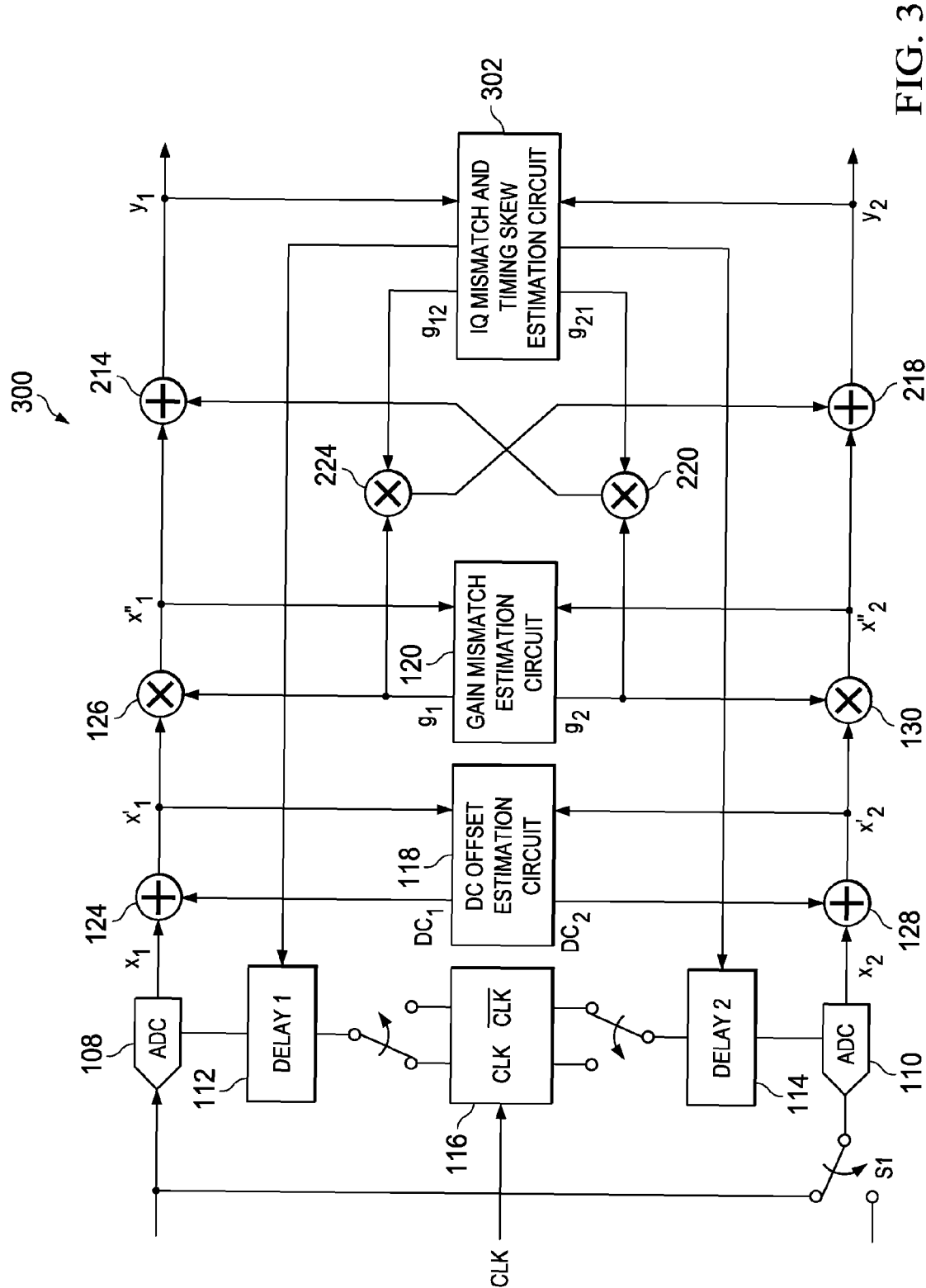

TIME-INTERLEAVED-DUAL CHANNEL ADC WITH MISMATCH COMPENSATION

TECHNICAL FIELD

The invention relates generally to analog-to-digital converters (ADCs) and, more particularly, to a dual channel ADC with mismatch compensation.

BACKGROUND

In Radio Frequency (RF) or wireless communication networks, transmitters and receivers are employed to communicate data. Looking specifically, however, to RF receivers, these devices generally operate in one of two modes: direct conversion or intermediate frequency. Each of the different modes offers different sets of benefits and drawback, which are taken into consideration when a particular receiver is designed.

Turning first to FIGS. 1A and 1B, a receiver 100 for an intermediate frequency architecture can be seen. With this intermediate frequency architecture, the analog input signal AIN is centered at an intermediate frequency by input circuitry (mixer 104 and oscillator 102, for example) and provided to analog-to-digital converter (ADC) 106. ADC 106 operates as a time-interleaved (TI) ADC with sampling rate of twice the bandwidth of the signal of interest (x(t), for example). Constructing such a TI ADC, such as ADC 106, however, generally requires compensation circuitry to correct for different mismatches that are often present in TI ADCs.

As can be seen in FIG. 1B, ADC 106 includes several mismatch correction circuits. As shown, ADC 106 is a dual channel ADC, meaning that two ADCs 108 and 110 are employed. Each of these ADCs 108 and 110 are clocked by clocking circuitry (buffer 116 and adjustable delay elements 112 and 114, for example). In this configuration, the clock signal provided to ADC 108 is substantially the same as the sample clock signal CLK, while the clock signal provided to ADC 110 is substantially the same as the inverse of the clock signal $\overline{CLK}$. Direct Current (DC) offset circuit (adders 128 and 124 and DC offset estimation circuit 118, for example) and gain mismatch circuit (adders 126 and 130 and gain mismatch correction circuit 120, for example) provide gain and DC offset correction. Additionally, timing skew estimation circuit 122 provides adjustments to delay elements 112 and 114 to provide timing skew correction.

Turning now to FIGS. 2A and 2B, a receiver 200 with a direct conversion architecture can be seen. With this architecture, ADC 106 operates at baseband with the signal centered at 0 Hz. In particular, input circuitry (oscillators 202 and 208 and mixers 204 and 206, for example) provides in-phase (I) and quadrature (Q) signals to ADC 210. As with ADC 106, ADC 210 also employs circuitry to correct for different mismatches. Some difference, though, between ADCs 106 and 210 are that each of the ADCs 108 and 110 of ADC 210 use the same clock signal (the sample signal CLK, for example) and that the time skew estimation circuit 122 is replaced with the IQ correction circuitry (IQ mismatch estimation circuit 220, multipliers 222 and 224, and adders 214 and 218, for example) to correct for IQ mismatch.

Some other conventional circuits are: U.S. Pat. No. 7,002,505; U.S. Pat. No. 7,277,040; and U.S. Pat. No. 7,352,316.

SUMMARY

A preferred embodiment of the present invention, accordingly, provides an apparatus. The apparatus comprises a first analog-to-digital converter (ADC) that receives a first input signal; a switch that receives the first input signal and that is adapted to receive a second input signal; a second ADC that is coupled to the switch so as to receive at least one of the first and second input signals; clocking circuitry that is coupled to each of the first and second ADCs so as to provide a first clock signal to the first ADC and a second clock signal to the second ADC; and mismatch circuitry that is coupled to the first ADC, the second ADC, and the clocking circuitry so as to operate in at least one of in-phase/quadrature (IQ) mismatch correction mode if the second ADC receives the second input signal and timing skew correction mode if the second ADC receives the first input signal.

In accordance with a preferred embodiment of the present invention, the clocking circuitry further comprises: a clock buffer that receives a sample clock signal and that generates the first clock signal and the second clock signal; a first adjustable delay element that is coupled between the clock buffer and the first ADC and that is coupled to the mismatch circuitry; and a second adjustable delay element that is coupled between the clock buffer and the second ADC and that is coupled to the mismatch circuitry, wherein the mismatch circuitry adjusts at least one of the first and second delay adjustable elements during timing skew correction mode.

In accordance with a preferred embodiment of the present invention, the first clock signal is substantially the same as the sample clock signal during time skew correction mode, and wherein the second clock signal is substantially the same as an inverse of the sample clock signal during timing skew correction mode.

In accordance with a preferred embodiment of the present invention, each of the first and second clock signals is substantially the same as the sample clock signal during IQ mismatch correction mode.

In accordance with a preferred embodiment of the present invention, the mismatch correction circuitry further comprises: a DC offset circuit that is coupled to each of the first and second ADCs so as to provide DC offset correction for each of the first and second ADCs; a gain mismatch circuit that is coupled to each of the first and second ADCs so as to provide gain correction for each of the first and second ADCs; and an IQ and timing skew mismatch circuit that is coupled to the first ADC, the second ADC, and the clocking circuitry so as to provide IQ correction for each of the first and second ADCs during IQ mismatch correction mode and to provide timing skew correction for each of the first and second ADCs during timing skew correction mode.

In accordance with a preferred embodiment of the present invention, a system is provided. The system comprising input circuitry that receives an analog input signal; and an dual channel ADC that is coupled to input circuitry, the dual channel ADC including: a first ADC that receives a first input signal from the input circuitry; a switch that receives the first input signal and that is adapted to receive a second input signal from the input circuitry; a second ADC that is coupled to the switch so as to receive at least one of the first and second input signals; clocking circuitry that is coupled to each of the first and second ADCs so as to provide a first clock signal to the first ADC and a second clock signal to the second ADC; and mismatch circuitry that is coupled to the first ADC, the second ADC, and the clocking circuitry so as to operate in at least one of IQ mismatch correction mode if the second ADC receives the second input signal and timing skew correction mode if the second ADC receives the first input signal.

In accordance with a preferred embodiment of the present invention, the input circuitry further comprises: an oscillator;

and a mixer that is coupled to the oscillator, the first ADC, and the switch, and that receives the RF input signal.

In accordance with a preferred embodiment of the present invention, the input circuitry further comprises: a first oscillator; a second oscillator; a first mixer that receives the RF input signal and that is coupled to the first oscillator and the first ADC; and a second mixer that receives the RF input signal and that is coupled to the second oscillator and the switch.

In accordance with a preferred embodiment of the present invention, an apparatus is provided. The apparatus comprises a first ADC that receives a first input signal; a second ADC; a switch that is coupled to the second ADC, wherein the switch provides the first input signal to the second ADC during a timing skew correction mode, and wherein the switch provides a second input signal to the second ADC during an IQ correction mode; a clock buffer that receives a sample clock signal and that generates a first clock signal and a second clock signal, wherein the first clock signal is substantially the same as the sample clock signal, and wherein the second clock signal is substantially the same as an inverse of the sample clock signal during the timing skew correction mode, and wherein the second clock signal is substantially the same as the sample clock signal during the IQ correction mode; a first adjustable delay element that is coupled between the clock buffer and the first ADC; and a second adjustable delay element that is coupled between the clock buffer and the second ADC; a DC offset circuit that is coupled to each of the first and second ADCs so as to provide DC offset correction for each of the first and second ADCs; a gain mismatch circuit that is coupled to each of the first and second ADCs so as to provide gain correction for each of the first and second ADCs; and an IQ and timing skew mismatch circuit to the first ADC, the second ADC, the first adjustable delay element, and the second adjustable delay element, wherein the IQ and timing skew mismatch circuit adjusts at least one of the first and second delay elements during timing skew correction mode, and wherein the IQ and timing skew mismatch circuit provides IQ correction for each of the first and second ADCs during IQ mismatch correction mode.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 3 is an example of a TI-dual channel ADC in accordance with a preferred embodiment of the present invention.

DETAILED DESCRIPTION

Figure 1A:
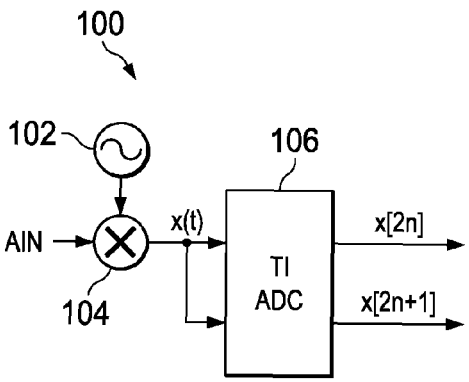
FIG. 1A is a block diagram of a conventional receiver having an intermediate frequency architecture.
Figure 1B:
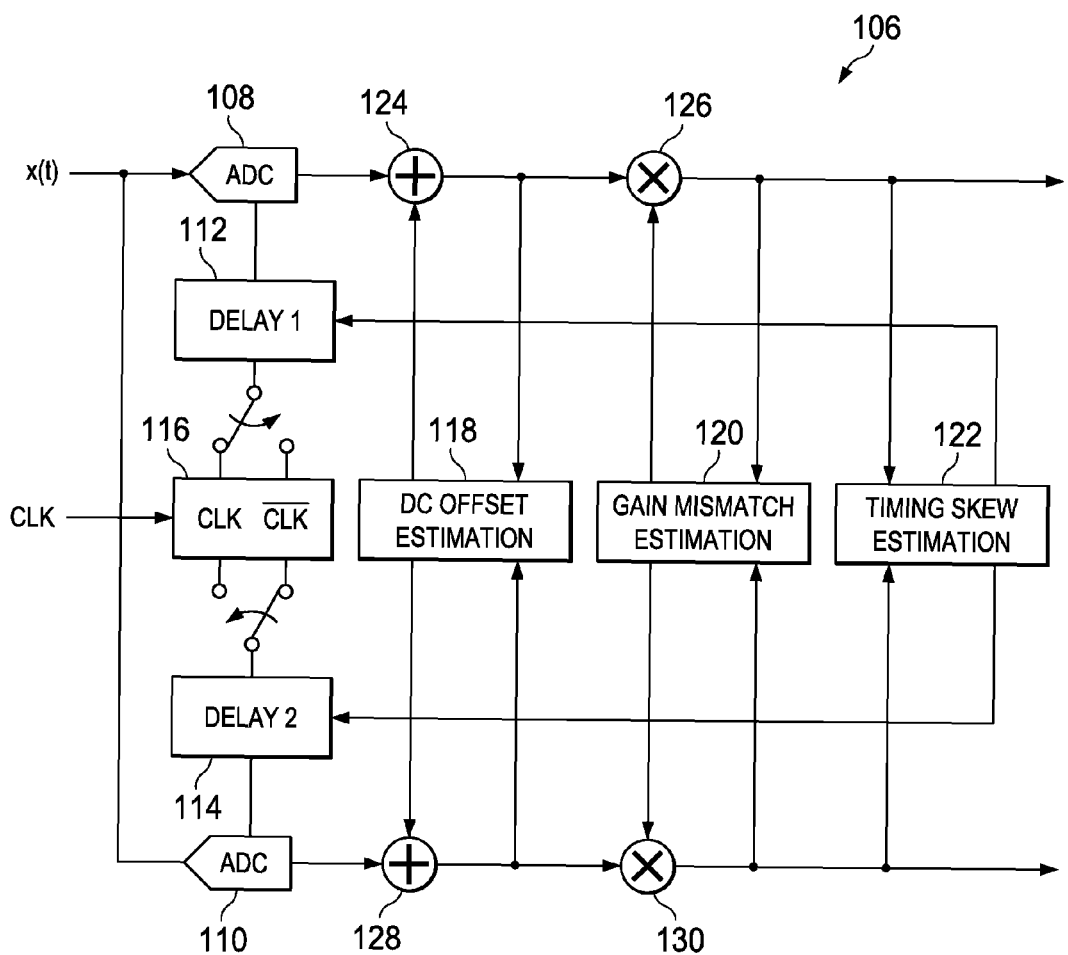
FIG. 1B is a block diagram of the time-interleaved (TI) analog-to-digital converter (ADC) of FIG. 1A.

Refer now to the drawings wherein depicted elements are, for the sake of clarity, not necessarily shown to scale and wherein like or similar elements are designated by the same reference numeral through the several views.

Referring to FIG. 3 of the drawings, a time-interleaved (TI)-dual channel analog-to-digital converter (ADC) 300 can be seen. ADC 300 generally comprises switch S1, ADCs 108 and 110, clocking circuitry, a direct current (DC) offset circuit, a gain mismatch circuit, and an in-phase/quadrature (IQ) and timing skew mismatch circuit. The clocking circuitry generally comprises adjustable delay elements 112 and 114 and buffer 116. The DC offset circuit generally comprises adders 124 and 128 and DC offset estimation circuit 118. The gain mismatch circuit generally comprises multipliers 126 and 130 and gain mismatch estimation circuit 120, and IQ and timing skew mismatch circuit generally comprises adders 214 and 218, multipliers 224 and 220, and IQ and timing skew mismatch estimation circuit 302.

While the overall construction of ADC 300 is similar to a combination of ADCs 106 and 210, a difference lies in the IQ and timing skew mismatch estimation circuit 302. Circuit 302 enables ADC 300 to operate in two different modes: IQ mismatch correction mode and timing skew correction mode. It was previously unrealized with prior art implementations that, with appropriate approximations, timing skew calculations and IQ mismatch estimations have similar expressions, allowing for overlapping circuitry. Looking first the DC offset correction, the DC offset estimation circuit 118 employs the following iterative calculations for ADCs 108 and 110, respectively:

$$DC_1(n+1) = DC_1(n) + \lambda_o E[x'_1(n)] \qquad (1)$$

$$DC_2(n+1) = DC_2(n) + \lambda_o E[x'_2(n)] \qquad (2)$$

where $\lambda_o$ is a constant coefficient and $E[\ ]$ is an expectation operator. Additionally, the gain mismatch estimation circuit employs the following iterative calculations for ADCs 108 and 110, respectively:

$$g_1(n+1) = g_1(n) - \lambda_g (E[x''_1{}^2(n)] - E[x''_2{}^2(n)] - E[x''_1(n)]^2 + E[x''_2(n)]^2) \qquad (3)$$

$$g_2(n+1) = g_2(n) - \lambda_g (E[x''_1{}^2(n)] - E[x''_2{}^2(n)] - E[x''_1(n)]^2 + E[x''_2(n)]^2) \qquad (4)$$

where $\lambda_g$ is a constant coefficient. Since the estimation of equations (1) and (2) approximately ensure that the expected value of each ADC 108 and 110 output is close to zero, equations (3) and (4) can be approximated as follows:

$$g_1(n+1) \approx g_1(n) - \lambda_g (E[x''_1{}^2(n)] - E[x''_2{}^2(n)]) \qquad (5)$$

$$g_2(n+1) \approx g_2(n) - \lambda_g (E[x''_1{}^2(n)] - E[x''_2{}^2(n)]) \qquad (6)$$

Bearing equations (1), (2), (5), and (6) in mind, timing skews and IQ mismatches can be determined.

In a timing skew correction mode, switch S1 is actuated such that ADC 110 receives the same signal as ADC 108. The use of the timing skew correction mode generally corresponds to the receiver configuration seen in FIG. 1A, where ADC 108 receives a clock signal that is substantially the same as the sample clock signal CLK, while the clock signal provided to ADC 110 is substantially the same as the inverse of the clock signal $\overline{CLK}$. In this configuration, circuit 302 sets the delay for the delay element 112 to 0, and estimates the delay for delay element 114 as follows:

$$\text{delay}_2(n+1)=\text{delay}_2(n)+\lambda_t(E[y_1(n)(y_2(n)-y_2(n-1))]) \quad (7)$$

where $\lambda_t$ is a constant coefficient.

Figure 2A:
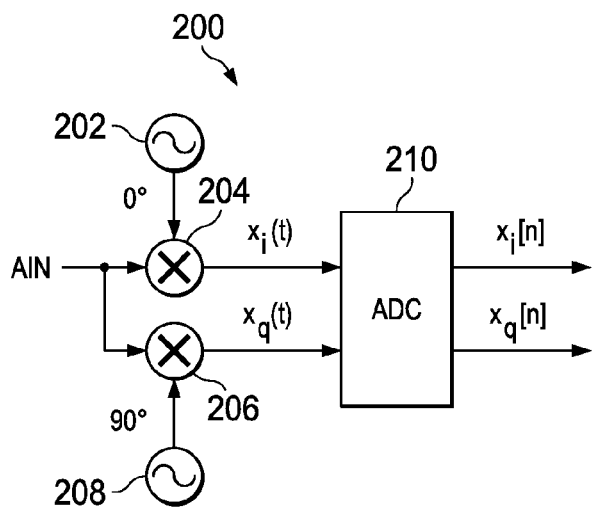
FIG. 2A is a block diagram of a conventional receiver having a direct conversion architecture.
Figure 2B:
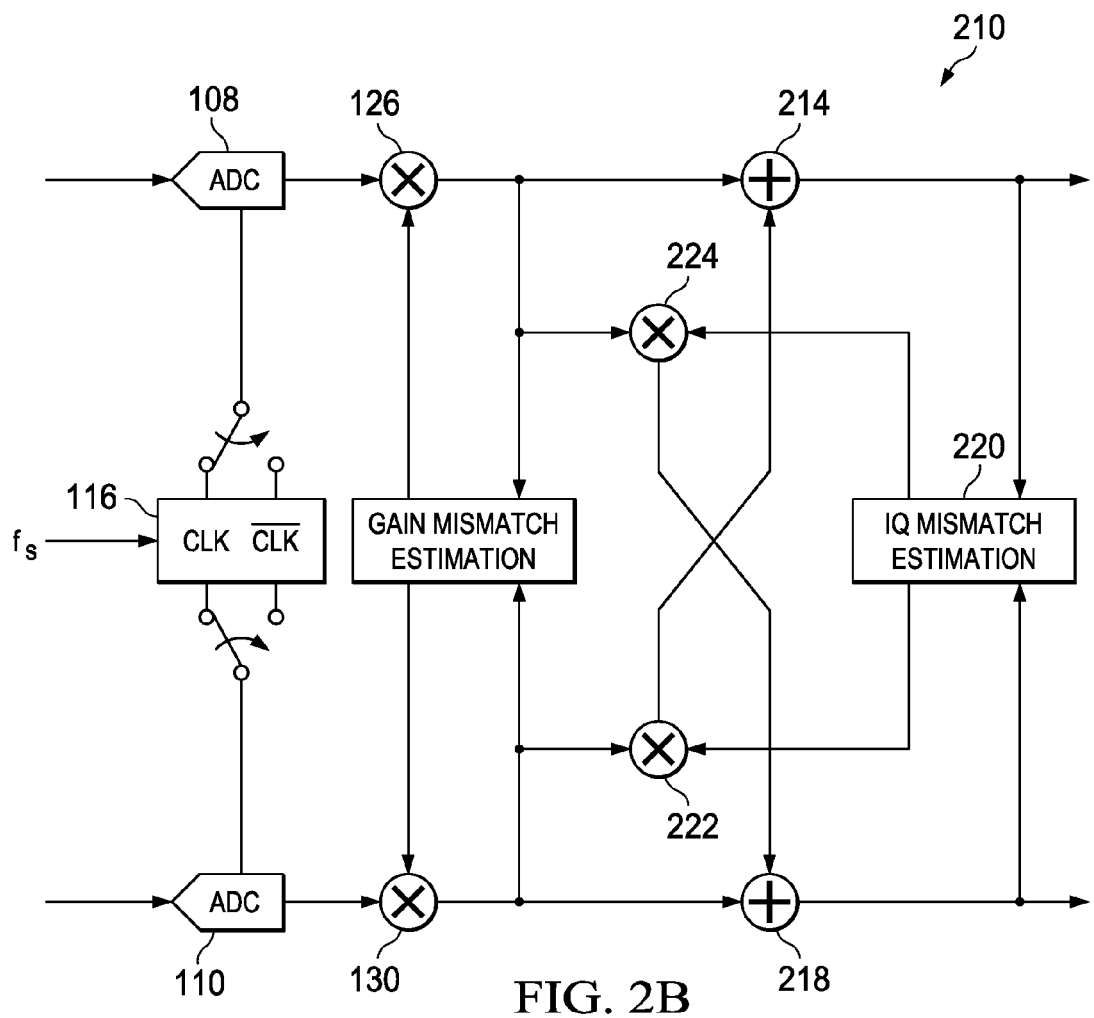
FIG. 2B is a block diagram of the ADC of FIG. 2A.

In the IQ correction mode, switch S1 is actuated such that ADC 110 receives a different signal from ADC 108. The use of the IQ correction mode generally corresponds to the receiver configuration seen in FIG. 2A, where ADCs 108 and 110 use the same clock signal and receive I and Q signals, respectively. In this configuration, circuit 302 estimates the IQ mismatch for ADCs 108 and 110, respectively, as follows:

$$g_{12}(n+1)=g_{12}(n)-\lambda_c(E[y_1(n)y_2(n)]-E[y_1(n)]E[y_2(n)]) \quad (8)$$

$$g_{21}(n+1)=g_{21}(n)-\lambda_c(E[y_1(n)y_2(n)]-E[y_1(n)]E[y_2(n)]) \quad (9)$$

where $\lambda_c$ is a constant coefficient. Since, again, the estimation of equations (1) and (2) approximately ensure that the expected value of each ADC 108 and 110 output is close to zero, equations (8) and (9) can be approximated as follows:

$$g_{12}(n+1)\approx g_{12}(n)-\lambda_c E[y_1(n)y_2(n)] \quad (10)$$

$$g_{21}(n+1)\approx g_{21}(n)+\lambda_c E[y_1(n)y_2(n)] \quad (11)$$

As can clearly be seen, equations (7), (10), and (11) are very similar calculations, allowing for the use overlapping circuitry. Thus, selection of an appropriate expectation operator E[ ] would allow for simple calculation of equations (7), (10), and (11). For example, the expectation operator E[ ] can be selected to be:

$$Ex(n)\frac{1^{p1}}{P_{p0}}xnp \quad (12)$$

where equation (12) is essentially an average of the input signal x(n). Other expectation operators may also be used. Moreover, circuit 302 can be implement in either hardware or through software via a (for example) digital signals processor (DSP).

By having ADC 300, several advantages can be realized. For the manufacturer of the ADC 300, it allows the manufacturer to produce a single part that can satisfy two different applications, allowing for a reduction in operating costs. Additionally, for designers of RF or wireless communications equipment, flexibility during the design process is greatly increased because the designer does not have to choose a particular architecture at the onset of the design process, which can greatly reduce design costs.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
a first analog-to-digital converter (ADC) that receives a first input signal;
a switch that receives the first input signal and that is adapted to receive a second input signal;
a second ADC that is coupled to the switch so as to receive at least one of the first and second input signals;
clocking circuitry that is coupled to each of the first and second ADCs so as to provide a first clock signal to the first ADC and a second clock signal to the second ADC; and
mismatch circuitry that is coupled to the first ADC, the second ADC, and the clocking circuitry so as to operate in at least one of in-phase/quadrature (IQ) mismatch correction mode if the second ADC receives the second input signal and timing skew correction mode if the second ADC receives the first input signal.

2. The apparatus of claim 1, wherein the clocking circuitry further comprises:
a clock buffer that receives a sample clock signal and that generates the first clock signal and the second clock signal;
a first adjustable delay element that is coupled between the clock buffer and the first ADC and that is coupled to the mismatch circuitry; and
a second adjustable delay element that is coupled between the clock buffer and the second ADC and that is coupled to the mismatch circuitry, wherein the mismatch circuitry adjusts at least one of the first and second delay adjustable elements during timing skew correction mode.

3. The apparatus of claim 2, wherein the first clock signal is substantially the same as the sample clock signal during time skew correction mode, and wherein the second clock signal is substantially the same as an inverse of the sample clock signal during timing skew correction mode.

4. The apparatus of claim 2, wherein each of the first and second clock signals is substantially the same as the sample clock signal during IQ mismatch correction mode.

5. The apparatus of claim 1, wherein the mismatch correction circuitry further comprises:
a DC offset circuit that is coupled to each of the first and second ADCs so as to provide DC offset correction for each of the first and second ADCs;
a gain mismatch circuit that is coupled to each of the first and second ADCs so as to provide gain correction for each of the first and second ADCs; and
an IQ and timing skew mismatch circuit that is coupled to the first ADC, the second ADC, and the clocking circuitry so as to provide IQ correction for each of the first and second ADCs during IQ mismatch correction mode and to provide timing skew correction for each of the first and second ADCs during timing skew correction mode.

6. A system comprising:
input circuitry that receives an analog input signal; and
an dual channel ADC that is coupled to input circuitry, the dual channel ADC including:
a first ADC that receives a first input signal from the input circuitry;
a switch that receives the first input signal and that is adapted to receive a second input signal from the input circuitry;
a second ADC that is coupled to the switch so as to receive at least one of the first and second input signals;
clocking circuitry that is coupled to each of the first and second ADCs so as to provide a first clock signal to the first ADC and a second clock signal to the second ADC; and
mismatch circuitry that is coupled to the first ADC, the second ADC, and the clocking circuitry so as to operate in at least one of IQ mismatch correction mode if the second ADC receives the second input signal and timing skew correction mode if the second ADC receives the first input signal.

7. The system of claim 6, wherein the clocking circuitry further comprises:
   a clock buffer that receives a sample clock signal and that generates the first clock signal and the second clock signal;
   a first adjustable delay element that is coupled between the clock buffer and the first ADC and that is coupled to the mismatch circuitry; and
   a second adjustable delay element that is coupled between the clock buffer and the second ADC and that is coupled to the mismatch circuitry, wherein the mismatch circuitry adjusts at least one of the first and second adjustable delay elements during timing skew correction mode.

8. The system of claim 7, wherein the first clock signal is substantially the same as the sample clock signal during time skew correction mode, and wherein the second clock signal is substantially the same as an inverse of the sample clock signal during timing skew correction mode.

9. The system of claim 7, wherein each of the first and second clock signals is substantially the same as the sample clock signal during IQ mismatch correction mode.

10. The system of claim 6, wherein the mismatch correction circuitry further comprises:
    a DC offset circuit that is coupled to each of the first and second ADCs so as to provide DC offset correction for each of the first and second ADCs;
    a gain mismatch circuit that is coupled to each of the first and second ADCs so as to provide gain correction for each of the first and second ADCs; and
    an IQ and timing skew mismatch circuit that is coupled to the first ADC, the second ADC, and the clocking circuitry so as to provide IQ correction for each of the first and second ADCs during IQ mismatch correction mode and to provide timing skew correction for each of the first and second ADCs during timing skew correction mode.

11. The system of claim 6, wherein the input circuitry further comprises:
    an oscillator; and
    a mixer that is coupled to the oscillator, the first ADC, and the switch, and that receives the RF input signal.

12. The system of claim 6, wherein the input circuitry further comprises:
    a first oscillator;
    a second oscillator;
    a first mixer that receives the RF input signal and that is coupled to the first oscillator and the first ADC; and
    a second mixer that receives the RF input signal and that is coupled to the second oscillator and the switch.

13. An apparatus comprising:
    a first ADC that receives a first input signal;
    a second ADC;
    a switch that is coupled to the second ADC, wherein the switch provides the first input signal to the second ADC during a timing skew correction mode, and wherein the switch provides a second input signal to the second ADC during an IQ correction mode;
    a clock buffer that receives a sample clock signal and that generates a first clock signal and a second clock signal, wherein the first clock signal is substantially the same as the sample clock signal, and wherein the second clock signal is substantially the same as an inverse of the sample clock signal during the timing skew correction mode, and wherein the second clock signal is substantially the same as the sample clock signal during the IQ correction mode;
    a first adjustable delay element that is coupled between the clock buffer and the first ADC; and
    a second adjustable delay element that is coupled between the clock buffer and the second ADC;
    a DC offset circuit that is coupled to each of the first and second ADCs so as to provide DC offset correction for each of the first and second ADCs;
    a gain mismatch circuit that is coupled to each of the first and second ADCs so as to provide gain correction for each of the first and second ADCs; and
    an IQ and timing skew mismatch circuit to the first ADC, the second ADC, the first adjustable delay element, and the second adjustable delay element, wherein the IQ and timing skew mismatch circuit adjusts at least one of the first and second delay elements during timing skew correction mode, and wherein the IQ and timing skew mismatch circuit provides IQ correction for each of the first and second ADCs during IQ mismatch correction mode.

* * * * *